Figure 1:
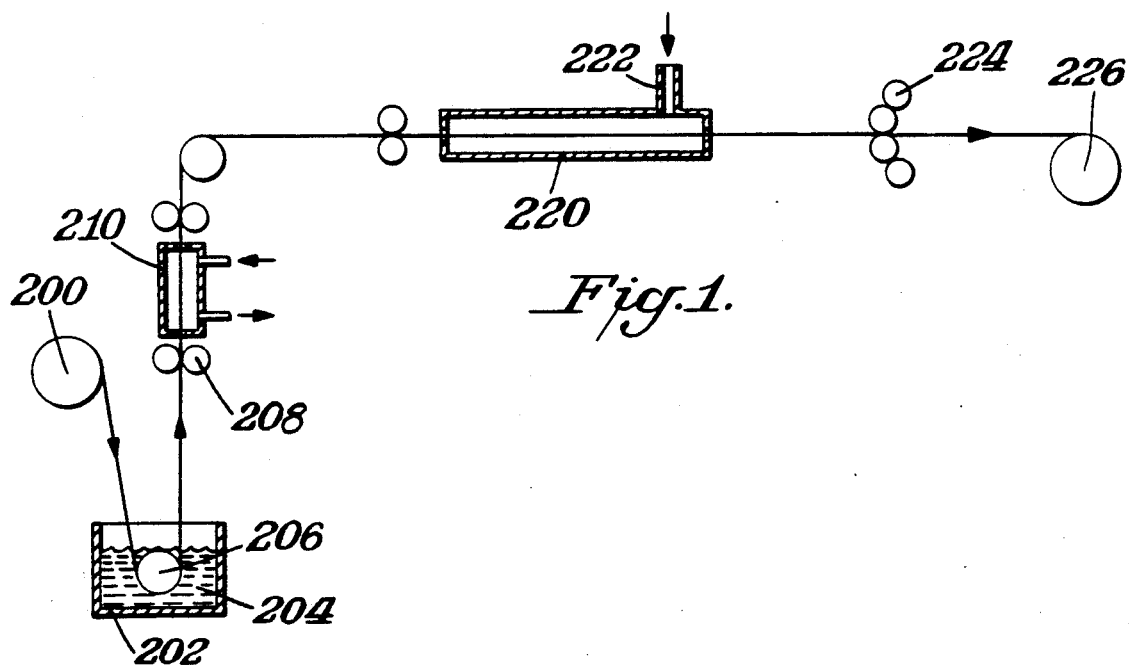

United States Patent [19]

Baldi

[11] Patent Number: 5,102,700
[45] Date of Patent: Apr. 7, 1992

[54] EXOTHERMICALLY FORMED ALUMINIDE COATING

[75] Inventor: Alfonso L. Baldi, Sea Isle City, N.J.

[73] Assignee: Alloy Surfaces Company, Inc., Wilmington, Del.

[21] Appl. No.: 608,999

[22] Filed: Nov. 1, 1990

Related U.S. Application Data

[63] Continuation-in-part of Ser. No. 472,663, Jan. 19, 1990, Ser. No. 433,119, Nov. 9, 1989, Pat. No. 5,028,385, Ser. No. 440,026, Nov. 21, 1989, Pat. No. 4,977,036, Ser. No. 533,879, Jun. 6, 1990, and Ser. No. 182,718, Apr. 18, 1988, Pat. No. 4,970,114.

[51] Int. Cl.⁵ .............................................. B05D 7/24
[52] U.S. Cl. .................. 427/383.7; 156/664; 419/9; 419/46; 427/190; 427/201; 427/397.8; 427/436
[58] Field of Search ............. 427/190, 201, 383.7, 427/397.7, 397.8, 405, 436; 106/1.05; 428/328, 653; 149/3; 419/9, 36, 46; 29/DIG. 16; 134/41; 156/664

[56] References Cited

U.S. PATENT DOCUMENTS

| | | | |
|---|---|---|---|
| 3,367,874 | 2/1968 | Haviland | 156/664 |
| 3,530,017 | 9/1970 | Mickelson | 156/664 |
| 4,009,146 | 2/1977 | Cork et al. | 427/229 |
| 4,327,134 | 4/1982 | Baldi | 156/664 |
| 4,459,216 | 7/1984 | Nakazato et al. | 156/664 |
| 4,464,430 | 8/1984 | Baldi | 427/252 |
| 4,617,202 | 10/1986 | Baldi | 427/253 |
| 4,793,968 | 12/1988 | Mosser et al. | 427/383.7 |
| 4,845,139 | 7/1989 | Baldi | 427/250 |
| 4,871,708 | 10/1989 | Baldi | 428/680 |
| 4,895,609 | 1/1990 | Baldi | 149/5 |
| 4,957,421 | 9/1990 | Baldi | 419/8 |

FOREIGN PATENT DOCUMENTS

| | | | |
|---|---|---|---|
| 738357 | 7/1966 | Canada | 156/664 |
| 52-42436 | 4/1977 | Japan | 156/664 |

Primary Examiner—Shrive Beck
Assistant Examiner—Terry J. Owens
Attorney, Agent, or Firm—Connolly & Hutz

[57] ABSTRACT

Pyrophorically activated aluminides of iron, nickel and cobalt, or mixtures thereof, are formed as discs or as coatings on substrates such as thin foils. The aluminide can be formed in situ by reacting aluminum powder with the aluminide-forming metal. Mixtures of these reactants can be applied to a substrate as such or suspended in a liquid like water or volatilizable organic liquids. Water is preferably used with a little binder such as an alkali metal silicate. An inhibitor is used to keep the water from reacting with finely-divided aluminum, and those silicates also perform such function. The pyrophoric products can be discharged to decoy heat-seeking missiles, or they can have their pyrophoricity destroyed to make catalysts. Pyrophoric action can be heightened by additives such as boron, and by post treatment with mild acid.

10 Claims, 3 Drawing Sheets

EXOTHERMICALLY FORMED ALUMINIDE COATING

This application is a continuation-in-part of

| Ser. No. | Filing Date | |
|---|---|---|
| 472,663 | Jan. 19, 1990 | |
| 433,119 | Nov. 09, 1989 | Patent No. 5,028,385 |
| 440,026 | Nov. 21, 1989 | Patent No. 4,977,036 |
| 533,879 | Jun. 06, 1990 | |
| 182,718 | Apr. 18, 1988 | Patent No. 4,970,114 |

The present invention relates to metal treatment, particularly in connection with the application of coatings.

Among the objects of the present invention are improved techniques for the application of coatings.

Additional objects include novel coated products.

The parent applications describe the coating of metals with aluminides that can be activated by leaching some of the aluminum from the aluminides. The inclusion of boron in the coating is helpful both for increasing the pyrophoric heat output from the leached products, as well as increasing the protection available when the aluminide coating is not leached.

Titanium can also be aluminized and/or boronized by the same type of treatments, to make it more resistant to corrosive attack. For this purpose the aluminum is not leached out. It is also very desirable to diffusion coat titanium in the absence of hydrogen and in the complete or substantially complete absence of conventional halide activators like $AlCl_3$ and $NH_4Cl$. Thus engine compressor blades made of Ti6A14V can be embedded in a pack of 20% Al-Si alloy powder containing 12% silicon, and 80% alumina, completely free of energizer, and at 1300° F. for 14 hours under argon, acquires a protective aluminide case 0.5 to 1 mil thick. Using pure aluminum instead of the Al-Si alloy reduces the case thickness by about half.

Adding ¼% $AlCl_3$ or $NH_4Cl$ energizer to the pack causes the titanium substrate to be significantly embrittled. However the aluminizing can be speeded by using a pack that had been pre-fired with such a halide energizer for a time long enough to drive out essentially all the energizer—at least one to two hours at 700° F. or higher. It appears that some energizer remains or some change is caused, to make the pre-fired pack much more effective in aluminizing the titanium. In any event the resulting aluminizing produces thicker cases, and can be readily effected at temperatures as low as 1000° F. or in times as short as 5 hours.

The addition to the pack of about 1/10% of a titanium halide such as $TiCl_2$, preferably sealed in a polyethylene tube so as to be protected against exposure to the atmosphere, is also helpful to speed up the diffusion coating. The polyethylene tube melts before the pack reaches diffusion temperature, releasing its contents.

The aluminized titanium compressor blades can then be boronized instead of or before applying a top coating as described above in connection with the Canadian patent. A suitable boronizing pack for this purpose is the diluent-containing pack of Example 2, using ammonium fluoborate as the energizer and with added titanium powder in an amount about half the amount of boron powder, by weight. A 0.3 mil boronized case is thus formed at 1075° F. for 14 hours in argon. The titanium powder helps keep the titanium substrate from being attacked by the halide in the pack, and can also be added to the pack used for aluminizing titanium. It can also be omitted, particularly when only a thin diffusion coating is desired. When the powdered titanium is used, it can range from about 1/5 the boron content to about equal the boron content by weight. Boron being a very high melting material, it can be used with little or no refractory diluent, particularly at diffusion temperatures low enough to keep the workpiece surfaces from reaching a sintering condition. On the other hand the boron content of a boronizing pack can be as low as 2%, although at least 4% is preferred. To be sure that no sintering takes place an inert refractory diluent like $Al_2O_3$, kaolin or MgO can be present in the pack in a concentration of at least 30%.

The re-use of packs containing sodium fluoborate energizer can be complicated by the gradual build-up of sodium fluoride with each use. This problem does not appear to arise when ammonium fluoborate is the energizer.

A preferred technique is to apply the mixture of powdered aluminum with powdered nickel and/or iron from a suspension of the powders in an aqueous solution of an inorganic binder that holds the powders in place on the substrate. This avoids the safety, health and environmental problems associated with the use of organic liquids like methylchloroform or acetone, to suspend the powders. Water-soluble inorganic binders include silicates and phosphates, both simple and complex. These binders, and particularly the alkali metal silicates are especially desirable in that they not only act as binders, but they inhibit the tendency for the fine aluminum powder to react with the water. Only about ½% of the binder based on the total weight of the suspension is generally adequate, but even ⅛% is effective.

Alkali metal silicates such as sodium silicates in which the $SiO_2/M_2O$ molar ratio is 2.8 or more have shown themselves highly suited. The following is a representative example:

EXAMPLE 1

A mixture is prepared of
82—grams 3 to 5 micron aluminum powder
77—grams minus 40 micron iron powder
21—grams minus 40 micron copper powder
40—milliliters tap water
0.2—gram aqueous sodium silicate, 39% solids, having a 3.22 mol ratio of $SiO_2$ to $Na_2O$.

The mixture is stirred to suspend all the metal particles approximately uniformly, and then a 1 mil thick pre-cleaned stainless steel foil is passed through it to pick up a coating containing about a ½ mil thick layer of powdered metal after drying. The coated foil is then dried, as for example by passing through a tube heated to about 200° C., and is ready for the treatment that causes the powdered metals to inter-react to form aluminides.

FIG. 1 illustrates the foregoing sequence. Here a coil 200 of the uncoated cleaned foil is uncoiled and the foil passed through a roller coating tank 202 containing the coating dispersion 204 and a dip roller 206. The dispersion is kept stirred, and the emerging coated foil is passed between grooved rollers 208 that adjust the coating thickness, and then through drier tube 210 followed by passage through tube furnace 220 initially heated to about 800° to 1000° C. to trigger the aluminide-forming reaction. A stream of protective gas such as argon can be flushed through tube 220, as at 222. The resulting coated foil is then passed through a set 224 of compacting rolls, after which it can be coiled up at 226.

The drying station can be placed close to the reaction station, or connected to be heated by the hot gas flow emerging from the reaction station, to reduce or eliminate the separate heating at the drier station. Also the application of external heat to the furnace tube 220 can be reduced or eliminated after the aluminide-forming reaction commences.

Adding about 1 gram of polyvinylalcohol to the foregoing suspension substantially improves the binder characteristics, as do other binder-type compounds like glycerol, polyethylene glycol, ethylene glycol and polyvinyl acetate that are essentially entirely driven off when heated to about 600° C. without liberating serious quantities of polluting gas. A little defoamer can be added to inhibit foam formation.

The copper powder can be omitted from the foregoing mixture, but such omission reduces the coherence of the reacted aluminides to the metal substrate.

Where the metal suspension is applied and dried within about 10 to 15 seconds after it is mixed, little or no inhibitor is needed.

Very thin substrates are desirable because they occupy less space when the pyrophoric end products are packed into discharge shells or the like; and also because the desired pyrophoric reaction produces high temperatures more rapidly when it does not have to heat up much substrate. To this end the substrate thickness should be not in excess of about 1 mil, preferably not in excess of about ½ mil. Alloy steels have a much lower thermal conductivity than iron or 1010 steel, and are helpful in reducing the heat sink thermal absorption by the substrate. Small holes, e.g., 10 mils in diameter, can be punched out of the substrate before it is coated, to further reduce its thermal absorption.

Where very thin substrates are desired, a foil ½ to 1 mil thick can have its thickness reduced by rolling or by chemical milling. Treatment with 3 to 5% room temperature aqueous nitric acid is a preferred milling technique, particularly when applied to a face of iron or plain carbon steels to which the coating is to be adhered, inasmuch as the adherence is then improved. Such steel foils can in this way have their thickness reduced to 1/10 to 6/10 of a mil.

An alternative substrate is a two of a single thickness of parallel-laid fibers of alumina or silica or the like in which the fibers are as thin as 2/10 to 1 mil. A very thin layer, about 1/10 to 5/10 mil thick, of a metal such as nickel can then be flashed, as by spraying or electroless plating, on the fiber layer to hold the fibers together and thus make an effective substrate having low thermal absorption.

After the aluminide-forming reaction, the carrier coated on one or both faces, is subjected to the leaching that develops the desired pyrophoricity. The pyrophoric reaction can be intensified by the preliminary mild acid treatment described in U.S. Pat. No. 4,927,798.

The pyrophoric product can be used for catalytic purposes, preferably by first destroying its pyrophoricity. Thus a treatment with hot or acidulated water, followed by aqueous $H_2O_2$, as described in U.S. Pat. No. 4,443,557, leaves a highly catalytic surface very suitable for electrolytic use with low overvoltage.

EXAMPLE 2

A mixture of
60 grams—3 to 5 micron powdered aluminum
40 grams—10 micron nickel powder
0.1 gram—aqueous sodium silicate, 39% solids, and having a $SiO_2$ to $Na_2O$ mol ratio of 3.2
0.5 gram—polyvinyl alcohol
0.1 gram—pine oil is prepared and applied by spraying to a nickel plated 60 by 60 iron screen. The nickel plating is about 1 mil thick.

The coated screen is then subjected to the heating that triggers the aluminide formation after which it is leached in 20% aqueous NaOH at 80° to 95° C. for 30 minutes. The resulting pyrophoric product is then placed in 80° to 90° C. water for 30 minutes to one hour, followed by 1/5% aqueous $H_2O_2$ for one hour at 20° C. If there is any pyrophoric tendency then remaining, the water-$H_2O_2$ treatments are repeated.

As in Example 1, a small amount of copper powder can be present in the aluminide-forming mixture, to increase its adhesion to the metal support.

The final product can be used for both electrolysis electrodes in electrolyzing 25% aqueous KOH at room temperature with extremely low over-voltages. Thus at 1.5 interelectrode volts, substantial electrolysis current flows.

For catalytic use, the thickness of the substrate is a secondary consideration, so that more rugged foils 1 or 2 mils thick or thicker can be used.

The metal powders can be applied dry to the substrate without suspending them in a liquid, but due to the disparity between the light aluminum particles and the heavier particles of the companion metal, uniformity is difficult to obtain. Also such application can only be made to one foil surface at a time.

As shown in parent Ser. No. 643,781, decoy elements can be produced from the pyrophoric products in a continuous operation, and the contents of that application are hereby incorporated herein as though fully set out. Modified techniques for producing decoy elements and for producing them on a continuous basis are disclosed in parent U.S. Pat. Nos. 4,895,609 and 4,957,421.

Of alternative significance is the internal coating of hollow jet engine blades made of superalloys such as B-1900 or other nickel base superalloys, with the blades suspended in a retort having a layer of activated diffusion coating powder on the retort floor under the blades. Thus Example 4 of U.S. Pat. No. 4,347,267 can be modified by not using the slurry for coating the interior of the blades there described, and instead vibrating into the cleaned and dried blade interiors a dry powder pack composed of, by weight:
45% chromium powder the particles of which are less than 20 microns in size
10% aluminum powder minus 200 mesh
45% calcined alumina minus 200 mesh
to which mixture ½% fine $NH_4Cl$ powder is added. The resulting pack was pre-fired at 1950° F. for 10 hours, and then fresh $NH_4Cl$ was added and the pack sifted through a 60-mesh screen to make sure no coarse particles are present. The material not passing through the screen was discarded.

The blades with the sifted pack filling their interiors are then mounted in one of the retorts illustrated in Ser. No. 230,333 and the retort floor covered with a ¼ inch thick layer a chromium-containing aluminizing pack such as one consisting of by weight; 45% chromium powder, 15% aluminum powder, and 40% alumina powder, activated with ½% ammonium chloride or ammonium fluoride or bifluoride, or a mixture of these. Alternatively the aluminizing pack on the floor and/or in the blade interior, can be a simple aluminizing pack such as one consisting of a correspondingly activated mixture, by weight, of 10% aluminum powder and 90% alumina powder.

The retort is first heated, with a hydrogen flush, to 1900°–1950° F. where it is held for 9 hours, after which the heating is terminated and the retorts cooled. The interiors of the cooled blades are cleaned out by blasts of high pressure air, leaving blades with about a 3 mil internal aluminized case of very good uniformity, and an external case of practically the same or slightly lesser thickness. The external case tends to be a bit thinner at those portions of the blade remote from the retort floor, as compared to the blade portions close to the floor.

The foregoing simultaneous internal and external coating technique is particularly suitable for workpieces having interiors accessible only through a passageway less than about 5 millimeters, or even less than about 2 millimeters wide. For passageways only about 0.1 millimeters wide, or narrower, the diffusion coating pack powder particles should be of extremely small size, as for example 10 to 20 microns. Using particles in the form of microspheres is also helpful, particularly in the smaller sizes, because such particles pour extremely readily. Other forms of pourable or fluent particles are also desirable.

Similarly effective diffusion coatings are formed with other superalloys, including cobalt-base superalloys, and even with other alloys and steels such as high-temperature steels. The layers on the retort floor can be any of those described in U.S. Pat. No. 4,347,267, and the packs loaded into the interiors of hollow blades or other hollow objects being coated, can also be selected from those that deposite the desired internal coating. Inasmuch as the objects being coated are not embedded in a pack, the labor involved is much reduced and heat-up and cool-down times also much reduced, as compared to the coatings described in U.S. Pat. No. 3,936,539.

A modified form of aluminum diffusion and leaching can also be used for applying coatings. In this modification there is first prepared an alloy of aluminum containing relatively small amounts of other metals to be coated onto a substrate. This pre-prepared alloy contains sufficient aluminum to bring its melting point down to 1800° F. or below, preferably 1400° F. or below. It can then be readily flame-sprayed on a workpiece, or the workpiece can be dip-coated in the molten alloy, and if desired the resulting coated workpiece heated in a protective atmosphere to improve the bonding. Where a protective atmosphere is used, it can be that of a diffusion coating activator like $NH_4Cl$ or $NH_4F$ or $NF_4HF_2$.

After the coating is completed, the coated workpiece is then dropped into a leaching bath that dissolves out most of the aluminum for the coating. Where some specific amount of aluminum is desired to be present in the coating after the leaching is completed, the leaching is terminated before the residual aluminum content drops too low.

After the completion of the leaching the workpiece has the desired coating, but the coating is in a microporous condition due to the voids introduced where the aluminum has been leached out. In such condition the coating is particularly receptive to receiving and anchoring top layers such as ceramic thermal barrier applied over jet engine vanes and blades.

A particularly desirable coating is the MCrAlY and MCrAlZr type coatings described in U.S. Pat. No. 4,005,989 and in the U.S. Department of Energy report DOE/NASA/259-26 NASA TM-81685 dated February 1981. Although these coatings contain only about 12 to about 15% aluminum by weight, a good aluminum-rich starting alloy for dip-coating or flame-spraying contains about 40 to 50% aluminum with the remaining alloying ingredients in the desired final proportions. About 3 hours of leaching in 20% aqueous NaOH at 140° F. subsequently removes essentially all the excess aluminum. The MCrAlY type coatings should not be leached too vigorously because the yttrium tends to be leached out by strong hot caustic.

After the leaching, the leached products are rinsed and then top-coated with a mixture of extremely fine particles of $ZrO_2$ and $Y_2O_3$ as described in the above-cited Department of Energy report and the references cited therein. Such top-coating generally have the $ZrO_2$ and $Y_2O_3$ in a molar ratio of from about 1:8 to about 1:12. Such mixtures can be slurried in water and the leached workpiece dipped in the slurry. The workpiece is now fired at about 2000° F. for a few minutes to secure the oxides in place, and the dipping and firing repeated to form an effective thermal barrier that can be about 5 to about 15 mils thick.

The "M" of the MCrAlY and MCrAlZr can be nickel, cobalt, iron or mixtures of any two or all three of these metals.

A thermal barrier is not needed when the diffusion coating is used for NOX removal and contains vanadium or other NOX-removing catalysts.

Other thermal barriers or top coatings can be substituted for or added to the $ZrO_2$ and $Y_2O_3$ mixtures, although ceramic barriers are preferred. Typical top coatings are shown in U.S. Pat. No. 4,260,654.

Any of these top coatings and thermal barriers can be applied over other porous undercoatings such as the porous nickel and platinum coatings described in U.S. Pat. No. 4,154,705. The nickel and platinum can themselves be applied as an alloy with aluminum or other selectively removable metal, and the selectivity removable metal then removed as by leaching.

Alternatively a superalloy jet engine blade can be flame-sprayed with an aluminum-rich Al-Pt alloy, after which excess aluminum is leached out and the final porous surface heat-treated at a temperature high enough, e.g. 2000° F., in a diffusion atmosphere to cause the surface metal to diffuse into and thus fill the pores.

A further modification is the low-temperature diffusion of an aluminum coating into the surface of a substrate such as a superalloy jet engine blade, followed by leaching to render the aluminized surface porous, after which a solution of a thermally decomposable compound of a desired metal like platinum is absorbed into that porous surface and dried. The resulting material is now subjected to a diffusion treatment with or without an aluminizing pack, to liberate the platinum or other free metal, fill the pores, and blend the surface metals.

Cobalt also provides a suitable porous undercoat when applied and then rendered porous. While iron is quite similar in its characteristics, the leaching of iron-aluminum undercoating should be quite limited inasmuch as heavy leaching leaves the porous iron residue poorly adherent to the substrate. Platinum, nickel and cobalt give very good results when their porous stratum is from about ½ to about 2 to 3 mils thick, but porous iron provided in this way should not be over 1 to 2 mils thick. The aluminum alloy thickness on which the porous strata are formed should be about one or two mils thicker than the final porous layer.

The porous nickel, iron, platinum, cobalt and silver surfaces described in U.S. Pat. No. 3,637,437 can also be used to better anchor top coatings, whether applied to the substrates disclosed in that patent or on other metallic or non-metallic substrates.

The foregoing leaching can leave a product with a pyrophoric porous stratum that spontaneously reacts with oxygen in the air. The nickel, cobalt and iron is covered by an oxide film as a result of such reaction, but this oxide film does not completely block the pores over which it forms and does not interfere with the application of top coatings. Where the substrates carrying the undercoatings are extremely thin themselves, the reaction with oxygen can cause a substantial temperature rise, particularly in the case of porous nickel.

The foregoing porous undercoatings of platinum, nickel, cobalt, iron, and even silver can also be used to better anchor an MCrAlY or MCrAlZr top coating which can then be applied by the standard plasma coating technique, and if desired can also be further protected by an overlying thermal barrier layer.

When preparing such catalytic platinum with an aluminum-diffusion step, the diffusion retort used to contain the diffusion materials tends to diffuse some of its constituents into the platinum. Carbon is thus frequently found in platinum that has been given a diffusion treatment in a steel retort. The use of a diffusion-coating retort made of nickel containing less than 0.1% carbon, does prevent such carbon contamination.

Figure 2:
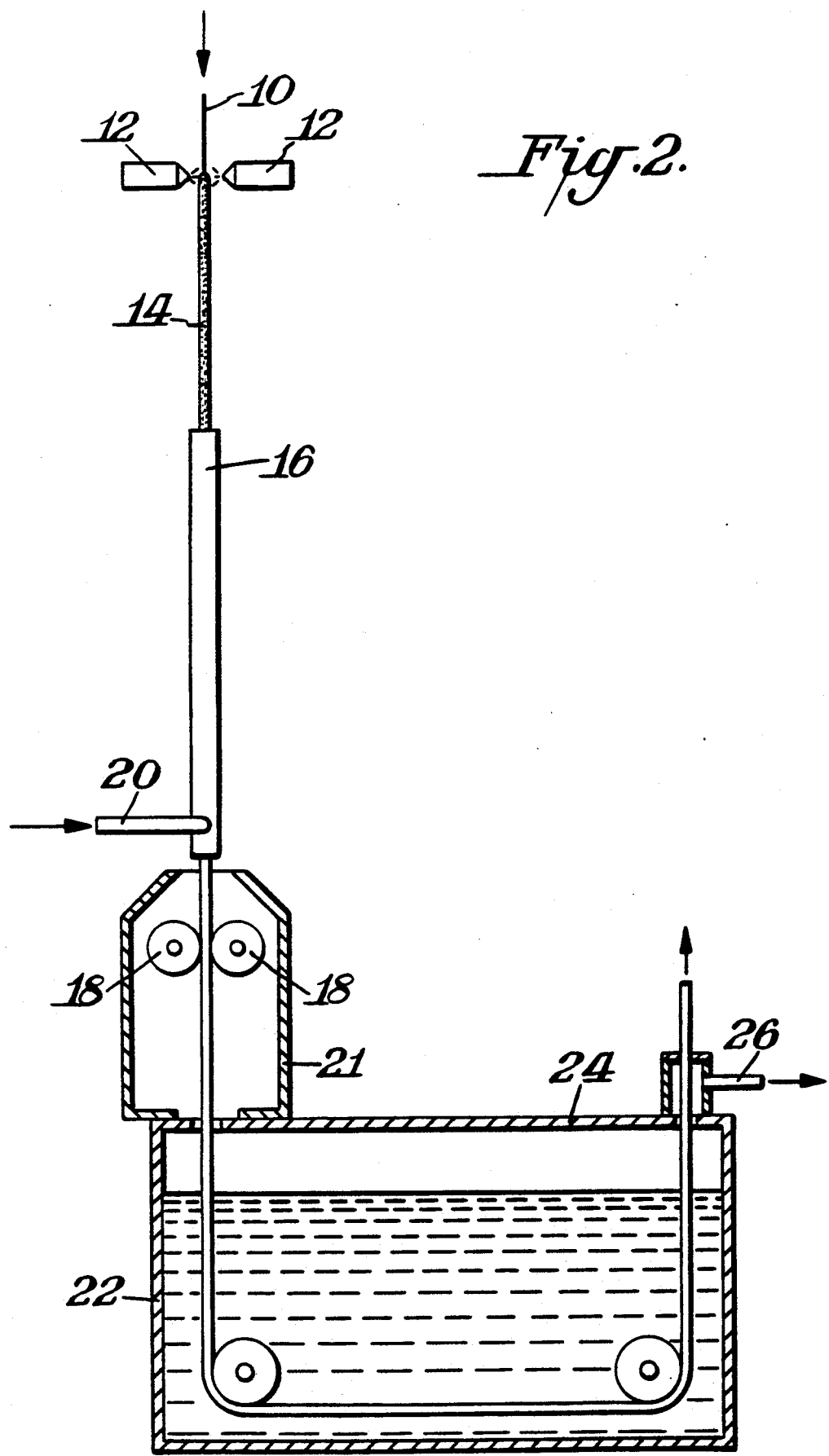

The pyrophoric material can be in the form of a sintered disc, or it can be prepared as a coating on a thin carrier web, as described in parent Ser. Nos. 205,387 and 182,718. FIG. 2 illustrates this modification.

In FIG. 2, a carrier foil 10 of stainless steel or 1010 steel about 1/40 to about 1/20 millimeter thick is spray coated on both its faces from spray nozzles 12,12 with a binder-containing mixture of iron powder and aluminum powder in a proportion that makes a Raney type alloy. The binder is a resin, preferably an acrylate, dissolved in a solvent like methyl chloroform. The powder particles are preferably no larger than about 5 to 20 microns.

The thus coated web 14 is led through an externally fired tube 16 of a tube furnace where it is rapidly heated to over 500° C. By that time the coating layers have been dried, the resin binder volatilized off, and the metal powders have interreacted to form the Raney alloy, $FeAl_3$ for example. After leaving the tube furnace but before the coatings have cooled excessively, the coated web 14 is passed between reduction rolls 18,18 where the hot Raney alloy is compacted to essentially eliminate voids.

A protective gas such as argon is preferably introduced, as at 20, into the furnace tube 16. Some of that gas will rise in tube 16 and thus protect the coated web from the oxidizing action of the ambient air as it heats up. Portions of the gas will also flow down from the exit end of tube 16 and similarly protect the hot emerging web. A cylindrical shell 21 may be positioned about the emerging web to help confine the downwardly-flowing protective gases against the hot web.

The reduction rolls 18,18 should be sufficiently massive so that they are not excessively heated by the hot web. If desired, the rolls can be liquid cooled to help hold down their surface temperature.

The compacted web is then led through a tank 22 containing aqueous caustic soda which dissolves much of the aluminum from the Raney particles on the web. The trip through the caustic soda is preferably arranged to take two to 10 minutes, as by adjusting the temperature and concentration of the caustic. The web entering the caustic can be as hot as 600° C. and the action of the caustic generates heat, so it is simpler to keep the caustic solution hot, at least about 80° C.

The caustic generates large quantities of hydrogen as it acts on the web, so that a hood 24 can be placed over tank 22, with a suction connection 26 to an aspirator that aspirates off the evolved hydrogen. The web emerging from tank 22 is wet with the caustic, and that caustic should be replaced.

As described in the parent applications Ser. Nos. 182,718, 205,387 and 289,595, the proportions of iron powder to aluminum powder can be varied, nickel powder can be substituted for some or all of the iron powder, and iron or nickel aluminides mixed with the incoming powders. The aluminide formation can be effected in stages as also described in those parents. The presence of a little copper in the sprayed-on coating mixture helps the aluminide coating adhere to a stainless steel web core. Instead of spraying the coating on the web, the web can be dipped in a coating bath, or applied by any other technique. The amount of coating should be such as to leave a compacted web not over about 1/5 millimeter thick.

When the coating layers contain iron aluminide, the caustic solution preferably contains a little dissolved tin, as described in the parent applications. Also as described in the parent applications, a little hydrogen peroxide can also be added to the caustic solution. Potassium hydroxide can be substituted for all or part of the sodium hydroxide.

The aluminide forming reaction in tube 16 is generally completed in a matter of seconds, so that the web can be passed through the furnace at a rate of about 3 meters per minute, and the furnace tube need be no longer than about 30 or 40 centimeters.

The above-described roll compacting carried out while the web is hot, at least 500° C., is more effective than on a colder web, and only requires a compacting force of about 30 kilograms per centimeter width of the web. Compacting can also be effected on the leached web, that is the web leaving the caustic solution, but is not as effective. The aluminide particles on the leached web are softer than those on the unleached web when the webs are at room temperature, but heating a pyrophoric leached web in an attempt to soften the leached particles, adversely affects their pyrophoricity. The greater the compaction, the more pyrophoric strips can be packed into a decoy shell used against heat-seeking missiles.

Some blades however are made of hafnium-containing superalloy, for example Rene 80, and do not accept aluminum or MCrAlY or MCrAlZr coatings well unless the surface being aluminized is treated to deplete its hafnium content. To this end the blades can be given a heat treatment with their airfoil surfaces packed in a mixture of powdered nickel and inert refractory diluent like alumina. Only about 10% nickel by weight in such a pack will be enough to adequately deplete the airfoil surface at 1200° F. for about one hour in a diffusion coating atmosphere such as one provided by the decomposition of NH$_4$Cl or other diffusion coating energizer.

The foregoing depletion can be quite pervasive, and is undesirable if it extends to the blade root where maximum strength is needed. The root is accordingly packed in a separate masking mixture such as the high-chromium masking powders of U.S. Pat. No. 3,801,357. A typical formulation for this purpose is a mixture of powdered Ni$_3$Al with powdered chromium and powdered inert refractory diluent, in which the chromium content is about 3 to about 10 weight %, and the diluent content is about ¼ to about ⅔ by weight. The Ni$_3$Al can be replaced by nickel aluminides having more than one-third and up to three-fourths atom of aluminum for every atom of nickel. The chromium content should be not over 15%, and the nickel aluminides can be omitted.

The temperatures at which such masking is effective are the same temperatures at which the airfoil depletion is effected, and can vary from about 1000° F. to about 2000° F. Inasmuch as very little depletion is needed, the depletion treatment is preferably kept short—not longer than about 2 hours at the masking temperature. Even ½ hour of depletion treatment improves subsequent coatings including aluminizing whether of the complex kind that uses a pack containing both chromium and aluminum powders or the simple pack treatment in which there is no significant amount of chromium in the pack, or whether the aluminizing is conducted in the gas phase as described in U.S. Pat. No. 4,347,267. Apparatus suitable for the masking of the present invention is shown in U.S. Pat. No. 3,801,317.

The Rene 80 alloy is a nickel-base superalloy, and cobalt-base superalloys can also contain hafnium and require surface depletion. The depletion treatment for cobalt-base superalloys can be exactly the same as for nickel-base alloys, including the use of the above-noted root-masking technique. However for the cobalt-base superalloys, cobalt aluminides can also be substituted for the corresponding nickel aluminides in the root-masking compositions. The root-masking compositions can also contain a very small amount of hafnium—about ¼ to ½%  by weight—to improve their masking effects.

MCrAlY and MCrAlZr coatings are generally applied by holding the workpieces in an evacuated chamber into which the coating ingredients are plasma sprayed. It is accordingly helpful to have the workpieces pre-masked as by embedding the portion to be masked—the root of a jet engine blade for example—in a masking powder, or by applying to that portion an adherent masking mixture. A very effective masking for this purpose is made of two superposed coating layers, the lower layer being a nickel aluminide layer as described in U.S. Pat. No. 3,801,357, and the upper layer being a thin coat of powdered nickel with or without a little powdered aluminum. The aluminide of the lower layer has less than one atom of aluminum for each atom of nickel, and can also contain a little chromium as described in U.S. Pat. No. 3,801,357. The aluminum powder in the upper layer should provide not more than one atom of aluminum for every three atoms of nickel in the upper layer.

The lower layer preferably has a thickness of about two to 10 mils, and the upper layer about 3 to 8 mils. In such a masking combination the lower layer prevents depletion from the workpiece portion it covers, and the upper layer forms an adherent protective sheath as the plasma spray operation starts thus anchoring both layers in place during the entire MCrAlY or MCrAlZr coating sequence. A little inert refractory powder such as alumina or mixed iron-zirconium-silicon oxides, can be mixed with the nickel powder of the upper layer, preferably not over 10% by weight of the nickel.

As noted when substantial quantities of iron and aluminum, or nickel and aluminum, or cobalt and aluminum powders are mixed and heated, they react with each other as the temperature reaches about 480° C. and generate large quantities of heat while very rapidly forming the aluminide. Thus for continuous formation of aluminide powders, iron or nickel powders or mixtures of the two can be further mixed with the aluminum powder and then poured onto a moving conveyor of Inconel 600 for example that carries the resulting mixture through an aluminuminizing atmosphere where the leading edge of the mixture is heated as by a burner or oven to initiate the reaction. When the reaction starts the burner can be turned off, and when an oven is used the oven can be temperature-controlled to reduce or cut off the heat it supplies, at the time the reaction supplies sufficient heat.

Moving metal foils such as said Inconel, that withstand the reaction, make suitable conveyors although the reacted particles tend to adhere to such foils. Where the particles are carried by foils of stainless steel, low alloy steel or plain steel, the adhesion is quite pronounced, so that the reaction product is a foil to which the reacted particles are sintered. No other conveyor is then needed. The reaction can take place so rapidly that no special atmosphere is needed so that it can be conducted in air. A stream of argon can be directed over the exposed moving foil to displace most of the ambient air.

Nickel powder effects aluminide formation with more vigor than iron powder does, and also provides, after leaching out aluminum, a pyrophoric product having somewhat more pyrophoric heat output. The aluminide-forming reaction can seriously degrade the supporting foil when that foil is iron or other metal not very resistant to high temperatures. To minimize such degradation it is preferred that there be no more than about ⅔ atom of nickel for every atom of iron in the powder mixture, and that there be not over about 2.6 atoms of aluminum for every atom of iron and nickel. For the most effective pyrophoricity there should be at least about 2 atoms of aluminum for every atom of iron and nickel. A proportion of 1½ atoms of aluminum for every atom of iron and nickel reacts to form an aluminide mixture that is slow to leach and becomes only mildly pyrophoric.

The aluminide-forming reaction proceeds very quickly after the powder mixture reaches reaction temperature. Where the powder particles are about 40 microns in size, the reaction time is generally not more than about 5 seconds and for smaller particles even less time is required. The use of a supporting foil that absorbs and/or conducts away heat very rapidly such as 0.05 millimeter thick copper, can extend the reaction duration if the powder mixture is in a layer less than about 0.1 millimeter thick. Layers at least 0.1 millimeter thick are preferred where the pyrophoricity is to attain the maximum radiation temperature.

The leaching that renders the aluminide pyrophoric is preferably carried out rapidly, as by treatment with 20% NaOH or KOH in water at about 60° to 95° C. for two to three minutes. Higher leaching temperatures and/or higher caustic concentrations further shorten the leach time, but longer leach times can be used as described in the prior art.

The aluminide-forming mixture can have additional ingredients incorporated to improve the pyrophoric output after leaching. A highly exothermic combustible material like powdered boron is very useful for this purpose, and only about 1 to about 4% of such powder in the aluminide-forming mixture is highly effective. Powdered carbon, magnesium and titanium are also useful additives, but they tend to ignite when the aluminide-forming reaction is conducted in a manner that does not completely shield the reacting mixture from the ambient air.

The following are very desirable exemplifications:

EXAMPLE 3

A length of SAE 1010 steel foil 1/40 millimeter thick has sprayed onto both faces a mixture of, by weight:
53.6 parts—325 mesh aluminum powder
29.6 parts—325 mesh iron powder
16.8 parts—325 mesh nickel powder
3.24 parts—325 mesh boron powder
175.5 grams of the mixture were dispersed in 93 grams of a 4% solution of poly(ethyl methacrylate) in methylchloroform, and sprayed on in that form to apply coatings that yield a pyrophoric product about 17/40 millimeters thick overall.

The foil with the sprayed-on coatings was then air-dried for about one minute and the thus-dried product passed through the heated tube of a tube furnace. The tube is about 25 centimeters long and heated to about 700° C., and a slow stream of argon is introduced into the open-ended tube as the foil passes through. Part way through the tube the coated foil becomes red hot, and on emerging about 40 seconds later is has begun to cool down.

The cooled product is passed through a heated 20% solution of NaOH in water. With the solution between 60° and 95° C., only about 2 to 3 minutes in the solution yields a leached product having an exceptionally high degree of pyrophoricity. That product, which is about 17/40 millimeters thick, is further improved by rolling it down between pressure rollers to a thickness of about $\frac{1}{4}$ millimeter. Rolling to reduce thickness of the coating by about $\frac{1}{4}$ to about $\frac{1}{2}$ gives best results when effected before leaching. Also such rolling is most effective when conducted before the hot freshly-reacted coating cools too much, although it works well when the cooling is almost complete.

The pyrophoric product is also improved by subjecting it, before or after rolling, to the post-treatment with citric acid or other mild acid as described in parent Ser. No. 28,741, the contents of which are incorporated herein as though fully set forth. The magnitude of the resulting improvement diminishes as the nickel-to-iron proportion increases.

The coating mixture can be applied by other techniques, such as by roller coating or by dipping the foil in a suspension of the coating mixture, or by merely pouring the powdered mixture on a surface of the foil while the foil is held with that surface extending in a horizontal plane. The binder content in the coating mixture can be reduced and even completely eliminated, particularly where only the upper face of the foil is coated. Such a one-sided coating can, after the aluminide formation, be repeated on the other face of the foil if desired.

The pyrophoric material is quite porous both before and after rolling, and can be impregnated with liquid or powdered materials as above noted that also improve the pyrophoricity, as by adding exothermic heat and/or varying the spectral response of the pyrophorically heated material.

Reducing the boron content of the original mixture to 1 part by weight, reduces the pyrophoricity somewhat. Eliminating the boron altogether, further reduces the pyrophoricity. Increasing the boron content to 6 or as much as 20 parts by weight increases the pyrophoric heat output. Powdered magnesium and/or titanium behave similarly.

It is preferred to incorporate the foregoing additive in the original powder mixture inasmuch as this reduces the intensity of the aluminide-forming reaction. However the additives can alternatively or additionally be incorporated in the leached product, as by suspending the additives as finely-divided powders in a liquid like water, and slurrying such suspension over the leached product.

The aluminide-forming reaction can alternatively be moderated by reducing the content of the nickel powder, reducing the content of the aluminum powder, or by adding diluents such as pre-formed iron or nickel aluminides as disclosed in the parent applications.

Increasing the nickel proportion or the aluminum proportion beyond the limits set out above makes the aluminide-forming reaction so vigorous that it causes the degradation of an iron foil on which the reaction takes place. It appears that such iron foil becomes aluminized and embrittled, as well as weakened by the high temperature of the aluminide-forming heat generation. The resulting foil breaks and falls apart fairly readily.

An iron foil 1/20 millimeter thick withstands such degradation a little better than a foil half as thick, but it is preferred to keep within the limits set out above, even for the thicker foil.

EXAMPLE 4

Figure 3:
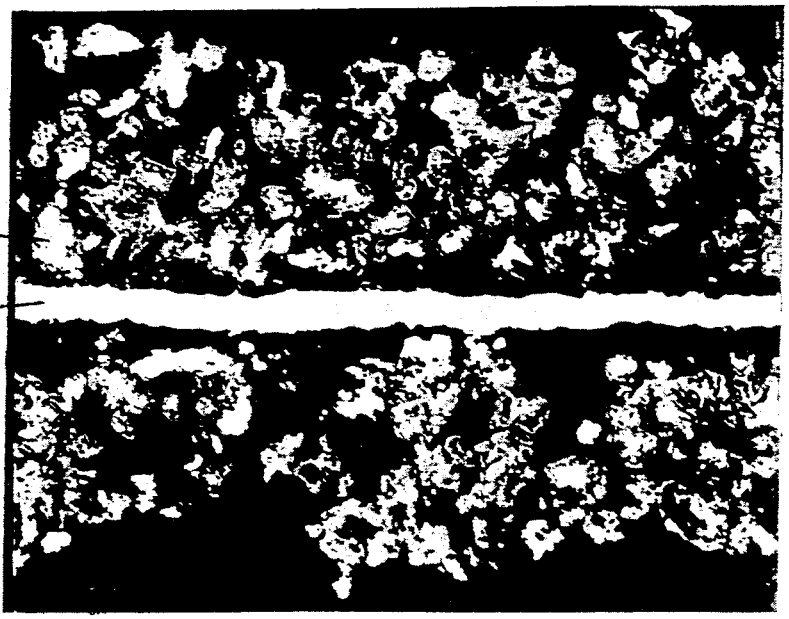

A mixture is prepared of the following powders, each about 10 microns in particle size:
Iron—One atom
Aluminum—2.5 atoms
Copper—0.1 atom
This mixture is dispersed in the binder solution of Example 3, sprayed onto both faces of its steel foil about 2.5 centimeters wide and about 25 microns thick and subjected to heat-induced reaction and subsequent leaching as in that example. The resulting product is illustrated in FIG. 3, and shows very good adhesion between the aluminide particles 50 as well as between those particles and the foil 60. On flexing this product only a few particles break off.

Figure 4:
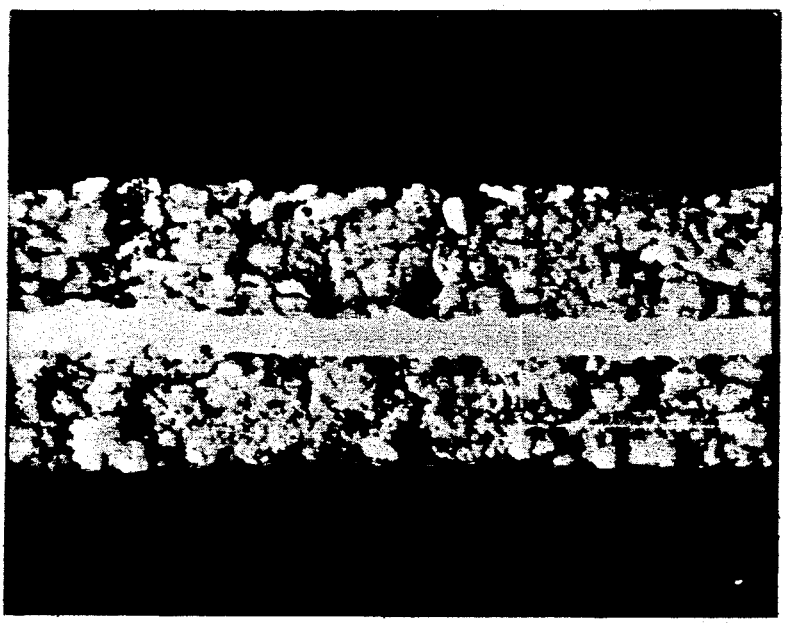

Rolling of the FIG. 3 product before or after leaching between steel rollers 9 centimeters in diameter biased toward each other by a force of 20 kilograms, compacts the product to the still-porous condition illustrated in FIG. 4 in which its thickness has been reduced from about 425 microns to a compact 250 microns. In general such compacting is very desirable and such aluminide coatings are preferably compacted to about half to $\frac{3}{4}$ of their original thickness.

The addition of 1 to 20% powdered boron to this initial powder mixture as in Example 6, or to the aluminide reaction product before or after leaching or after compacting, substantially increases the pyrophoric heat output of the product.

Omitting the copper from Example 4, reduces the adhesion of the iron aluminide particles or of nickel aluminide particles to iron and steel foils. At least about 1/30 atom of copper for each atom of iron and nickel, will provide such increased adhesion, and more than ½ atom of copper is not desirable.

A particularly desirable technique is to apply to a one-mil thick foil of 1010 steel, a dip coating having the following powders:
222 g. Al
207 g. Fe
75 g. Cu
5 g. B
dispersed in 100 g. acetone in which is dissolved 10 grams of polyethylacrylate.

After drying, the coating is about 20 mils thick on each face of the foil, and the coated foil is subjected to the heat treatment and leaching of Example 3 to produce a very effective pyrophoric product.

The same treatment can also be applied to ½ mil thick type 302 stainless steel, preferably after the coating dispersion is thinned with an additional 15 grams acetone.

Foils of low alloy steels, i.e. iron alloyed with not over 5% other metals, behave like SAE 1010 steel and like Armco iron, in respect of their poor resistance to the aluminide-forming reaction heat.

The hot aluminide-carrying foil can be directly introduced into the leaching bath before the foil cools down to the bath temperature. Due to its large surface-to-mass ratio, only about 15 to 20 seconds cooling will get it down to a temperature at which is does not cause violent localized boiling as it enters the bath, particularly if the cooling is aided by a blanketing stream of cool protective gas like argon or nitrogen. The leached product is preferably between about 0.3 and 0.7 millimeters thick. The activated foils can also be prepared by applying on a metal foil or gauze carrier, as by Schoop spray, an adherent coating of iron and nickel aluminides having a sufficiently high aluminum content, and then subjecting such aluminide-carrying webs to the leaching treatment that extracts aluminum and develops pyrophoricity. Inasmuch as the leaching reduces the adhesion, the coated web is preferably heat treated at a temperature of 700° C. or higher to increase the adhesion before leaching. It is also preferred to keep the aluminum proportion to between 1½ and 2 atoms for every atom of iron and nickel. Before leaching, the coated web can be between about 25 and about 400 microns thick, but thicknesses not over about 50 microns are preferred inasmuch as they leach through much more readily. The foil or gauze should be as thin as practical, generally less than 25 microns thick.

The leaching should remove about ½ to about ¾ of the aluminum in the aluminide, or should proceed until the leaching reaction slows down to an insignificant rate. Thus a 13 micron thick iron foil coated with $FeAl_2$ to a total thickness of 50 microns will be adequately leached through in about 5 minutes or less by a 20% solution of NaOH or KOH in water at a temperature at least as high as 60° C. At boiling temperature or with higher concentrations of caustic, the leaching only takes about two minutes.

After leaching, the leached web is pyrophoric and should be kept out of contact with oxygen or air until ready for use. It can be rinsed with water and then subjected to the mild acid treatment of U.S. Pat. No. 4,927,798 as noted above.

The leached foil is sufficiently porous to pick up 1 to 2% very finely divided boron powder from a slurry in water or methylchloroform. Adding about 1% resin binder to such slurry helps with the boron pick-up and also causes some boron powder to adhere to the outer face of the foil.

Alloying from about 1 to about 10% boron in the original aluminide foil makes it unnecessary to add boron by an after-treatment. Such alloying can be conventional melt alloying, or diffusion boronizing.

Before or after activation the foils can be cut into strips suitable for use as heat-seeking missile decoys. Cutting after activation is preferably conducted under water or in an argon or nitrogen box.

Alternatively small strips of the original aluminide foil can be prepared and they can be leached as by loading them in a perforated basket which is then lowered into the leaching bath for the appropriate time. Upon completion of the leaching, the strips can be rinsed as by lowering the basket into rinse water. After the rinsing the basketful of strips can be dipped into the mild acid bath that increases their pyrophoricity, and then again rinsed.

The original small strips of foil can be prepared for treatment by cutting up a long foil or by forming the strips from molten aluminide as described for instance in U.S. Pat. No. 4,755,353.

A particularly desirable technique for improving the spectral response of a pyrophoric web is to provide a face of the web with a highly specular surface which in turn has its external face coated with an alkali metal silicate. The highly specular surface can be polished metals like stainless steel, copper, aluminum or silver and should have a specular reflection of at least about 70% to red light. The alkali metal silicate preferably has an $SiO_2:M_2O$ mol ratio between about 2 and about 5, and should be at least about 10 microns thick.

Where the pyrophoric web already contains a specularly-surface metal foil like stainless steel, the alkali metal silicate can be applied directly to that specular surface. Sodium or potassium silicates having a 3.22 mol ratio are very effective.

The specular surface can be provided by cementing a specularly-surfaced foil to a face of the pyrophoric web, or by metallizing that face with aluminum at high vacuum. High vacuum deposited aluminum flakes are available in the market place and can be deposited from suspension in a binder-containing volatilizable liquid. An aqueous solution of the alkali metal silicate can be used as a cementing material or as the above-mentioned binder. The face of the pyrophoric web to which a separate specular surface is applied, can be the face of the pyrophoric aluminides before or after rolling, and before or after leaching can be the face of a supporting foil or screen. Where a specular foil is applied, that foil should be very thin, less than about 25 microns thick.

A little boron or chromium oxide can be suspended in the alkali metal silicate to further improve the spectral response, as described infra.

As noted, the supporting foil or screen can be a highly exothermic easily ignitable metal such as zirconium or titanium, whether or not any spectral-response-adjusting coating is applied.

The ignition temperatures referred to above are the lowest temperatures at which the metals there discussed ignite in air. Pyrophoric metals react and ignite at extremely low temperatures and are accordingly not considered as having an ignition temperature. When an ignition temperature is mentioned it is accordingly in connection with a material that is not pyrophoric. Carbon and boron, both of which are ignited by the pyrophoric metals, can be considered ignitable metals for the above purposes.

The radiation characteristics of a burning carbon fiber web are also improved by coating it with borosilicate or borochromate particles in which the boron oxide content is from about 5% to about 50%.

About a 1/10 to 15-mil thick layer of pyrex glass particles ground to about 200 mesh and adhered to one face of a 5 to 30-mil thick carbon fiber cloth, provides a radiation pattern particularly desirable for decoying heat-seeking missiles. A little binder solution such as that used in connection with Example V can be used to secure such coating in place, so that all that is needed is to spray on the binder solution containing the powdered glass particles suspended in it, and then permitting the sprayed-on coating to dry.

The sizes of the individual glass particles should be from about 10 to about 100 microns.

A further improvement in the foregoing radiation characteristics is obtained when a layer of aluminum particles is interposed between the powdered glass coating and the carbon fiber cloth. Such aluminum layer can be from about 1/10 to about 1-mil thick, can consist of aluminum particles also about 10 to about 100 microns in size, and can be applied the same way described above for the glass particles. Drying of the binder-containing aluminum particle layer permits the spraying over it of the glass particle layer without excessive smearing of the aluminum particles. Aluminum alloys containing at least about 80% aluminum can be used in place of pure aluminum.

A very effective coated and self-igniting carbon fiber cloth is prepared by starting with a 16-mil thick cloth that is activated by pitting and coating with lead acetate in accordance with the prior art. On one face, there is applied a ½-mil thick layer of aluminized particles, which is dried and followed by a 11.5-mil thick layer of particles of the following glass composition, by weight:

72%—$SiO_2$
25%—$B_2O_3$
0.5%—$Na_2O$
1%—$Al_2O_3$
1%—$K_2O$
0.5%—$Li_2O$

The resulting material is dried again and is now placed in an argon box. While in an argon atmosphere the uncoated cloth face is sprayed with a 16.5-mil thick layer of 325 mesh pyrophoric iron particles, dried and the pyrophoric layer then top-coated with a 0.5-mil thick layer of the same glass particles previously applied. Another drying step, still under argon, completes the product. When that completed product is exposed to air, its pyrophoric coating promptly ignites and then ignites the carbon fibers of the cloth. The entire cloth burns away and in doing so very effective radiation is generated.

The last borosilicate layer can be omitted without seriously detracting from the radiation effectiveness.

Another borosilicate that can be used is a simple pyrex formulation of:
80.6%—$SiO_2$
13.8%—$B_2O_3$
4.0%—$Na_2O$
1.6%—$Al_2O_3$ Simple mixtures of $B_2O_3$ and $SiO_2$, as well as of $B_2O_3$ and $Cr_2O_3$ are also effective, but are not as effective unless sintered or fused together.

Melt alloying iron with sufficient aluminum to make an aluminide ranging from $FeAl_2$ to $FeAl_3$ and with 5 to 20 percent of boron by weight of the iron, provides a product that can be ground and readily leached of sufficient of its aluminum to give a very effective pyrophoric powder. A correspondingly made nickel alloy is similarly suited. The radiation effectiveness of such powders, as well as of the boron-containing products of Examples VII and VIII, is improved by adding some silicon or silicon dioxide, preferably as a surface coating. In general, the boron to silicon ratio should have about 5 to about 50% boron.

The pyrophoric particles or the porous members carrying such particles are effective solid fuels that can be injected into turbine engines to burn and thus operate such engines. For this purpose the particles and the porous members should be very finely divided so that they burn rapidly. In order to simplify the storage of the particles, their surfaces can be coated or impregnated so as to prevent pyrophoric action until after the particles are injected into the engine intake where the elevated temperatures normally at the intake will then cause the particles to ignite.

Thus the particles can be dipped in liquid perfluoroalkane having a boiling point of 215° F., then removed from the liquid and dried by rolling them over paper towels, or blowing argon over them, until they appear to be free of surface liquid. Notwithstanding that appearance, the particles do not spontaneously ignite when merely exposed to air, even upon ten days exposure to air.

However when exposed to air and heated to about 150° C. they promptly ignite and then go through a complete combustion. At this ignition temperature it appears that residual liquid in the porous surface of the particles is driven off to permit the pyrophoric action.

Similar results are obtained with hydrocarbons or other relatively inert liquids that have boiling points of at least about 200° C. Paraffin wax also behaves similarly but requires a temperature of at least about 250° C. to be ignited. Pyrophoric iron or other metal powders so treated make particularly desirable solid fuels for turbine engines which have compressor sections that operate at temperatures sufficiently high to effect the foregoing ignition. Such metals can be relatively soft so that they do not excessively erode the engine as they move through it. Alloying boron or carbon or both with these metals increases their hardness but gives less erosive combustion products. It is accordingly preferred to add carbon as finely divided graphite particles, or as graphite coatings on the pyrophoric particles.

For engines in which the intake temperature is at least as high as 300° C., pyrophoric action is so markedly accentuated that more than 30 weight percent boron can be alloyed with iron or nickel that is subsequently pyrophorically activated, without swamping out the pyrophoricity. The boron content can be increased to about 50 to 60 weight percent for still higher intake temperatures. It is preferred to have no more than about 70% boron in such an alloy inasmuch as at higher concentrations the boron burns to a sticky liquid boron oxide that coats the surfaces of the burning particles and seriously hinders or prevents further combustion.

Titanium activated by aluminizing and leaching can also be used. Such titanium, still containing a little of the aluminum, can be heated in air or under other oxidizing conditions to convert some of its porous activation case to mixed titanium aluminum oxides and such a treated titanium makes a very effective photo-anode for photolysis of water containing a little NaOH. Even without the heat-treatment it is a very good photo-anode. Tin can also be diffused into titanium to provide similar results with and without the subsequent oxidation.

Whether the zincized, aluminized or stannized titanium is used as a photo-electrode, a platinum or platinized platinum or activated platinum counter-electrode is helpful. Activated platinum made as described in U.S. Pat. No. 4,154,705 is particularly helpful. A little ruthenium, such as 1 to 5% by weight can be incorporated in the titanium before it is aluminized, zincized or stannized, as a further improvement.

Instead of using separate electrodes for the photolysis, they can be provided in powdered form and mixed with each other as well as with other substances such as cadmium sulfide that also help with the photolysis.

Hydrogen peroxide appears to form during the foregoing photolysis and some exothermic heat is also generated and can be used to help keep the photolysis combination warm.

The pyrophoric effects of the Raney-type activated metals is preferably improved by diffusing boron into the Raney surface before it is activated. This is shown in the following example:

EXAMPLE 5

Three-hundred grams of powdered 325 mesh $FeAl_2$ is thoroughly mixed with 10 grams powdered boron and 6 grams of powdered $NaBF_4$. The mixture is placed in a carbon steel retort which is then fitted into a tube furnace, and heated while a flushing gas is passed through the tube as in Example 1. A heat of 980° C. held there for 1½ hours under hydrogen, introduces about 7% boron into the $FeAl_2$ powder, based on its iron content.

The retort contents are partially sintered together as a result of the diffusion heat, but can be fairly easily removed from the retort after banging the outside of the retort with hammers or mallets. Crushing and/or grinding readily reduces the mass to very small particle size. Then on leaching aluminum out of the resulting product mass as by a 60-minute treatment in 15-16% aqueous NaOH that is cooled to keep it below 50° C. followed by washing, the activated particles remaining are quite pyrophoric and on exposure to air heat up to temperatures of about 540° C. Higher and lower leaching concentrations and temperatures can also be used, but are less desirable.

Longer diffusion boronizing provides, after leaching, an activated iron-aluminum-boron alloy powder containing as much as 30% boron based on the weight of its iron, and which upon exposure to air heats up to over 650° C. Boron contents greater than about 30% provide decreasing heat-up and at about 40% leave the leached powder non-pyrophoric. It is preferred that the boron penetrate through the entire thickness of each powder particle and that each particle have a uniform composition throughout its thickness.

Similar results are obtained when $FeAl_3$ powder is used in place of the $FeAl_2$, when alloys of intermediate proportions are used, and when the corresponding nickel-aluminum alloys are used. Some of the alloys are not as brittle, and therefore not as easily grindable as others. If the iron-aluminum alloy powder particles being boronized are over about 1 millimeter in size, the boronizing treatment times should be substantially lengthened if the boron penetration is to be complete. Other boronhalides such as ammonium fluoborate, $BBr_3$ and $BI_3$ can be used as energizers. In general the energizer content of the pack should be from about 1 to about 3% by weight, and the diffusion temperature at least about 760° C.

By not using an inert refractory diluent in the boronizing pack, it becomes unnecessary to later separate such diluent from the boronized powder.

The foregoing boronizing of self-supporting substrates such as foils requires much more care and should be conducted with inert refractory diluent in the pack. Thus conducting the same boronizing on lengths of one-mil thick aluminized iron foil is awkward because such foil is extremely brittle and difficult to handle. The following is a preferred example.

EXAMPLE 6

Such boronizing can be satisfactorily effected in the following powder pack:
200 grams—powdered alumina
10 grams—powdered boron
5 grams—sodium or ammonium fluoborate,
at 510° C. for 18 hours, or at 565° C. for 3 hours, in a hydrogen-bathed atmosphere. The boron then penetrates about half way through the aluminized case.

Aluminum loss to the boron in the pack also takes place. The aluminizing of an iron-boron alloy in an attempt to introduce sufficient aluminum to give a pyrophoric product after leaching, causes excessive loss of boron from the substrate to the pack.

The activated powders containing boron, or even free of boron, are stored out of contact with air or oxygen to preserve their pyrophoricity. Water is not a suitable preserving liquid for the activated boron-containing powders. Acetone preserves them for at least three weeks, as does an azeotropic mixture of Trifluorotrichloro ethane with methylene chloride, described in U.S. Pat. No. 2,999,817. Ordinary fluoro-chloro ethanes and methanes that are normally used as refrigerants or propellants are also suitable and they can be used by themselves or mixed with each other or with acetone. Mixtures of the activated powders with preserving liquids that are also propellants, are particularly desirable in that they can be packed in an aerosol-type container from which they are readily discharged to provide a cloud of pyrophorically oxidizing particles.

When making sintered aluminide discs, nickel powder can be substituted for the iron powder in the compacts, but is preferably mixed with 1½ times its weight of aluminum powder. A 50-mil thick disc press-sintered from such a mixture and then leached 14 hours with hot 20% aqueous NaOH is more pyrophoric than the leached iron-aluminum disc of Example 1, but its pyrophoricity does not last as long. Such a leached nickel-aluminum disc can have its pores impregnated with inert particles such as the alumina and silica mentioned supra, to stretch out its pyrophoric heat output. On the other hand it can be impregnated with heat-generating materials to further accentuate its high heat output. It will for example ignite micron-sized boron particles without the need for the low-ignition-temperature zirconium.

Iron foils are very inexpensive starting materials from which to make the decoys, and they can be activated on one or both of their surfaces. The degree of activation is such that the foil thickness after activation is about 2 to 3 times its thickness before activation. When starting with an unactivated foil as thin as about 1 or 1½ mils, and as thick as about 3 mils, the activated and corrugated or accordion-folded foil will, when ejected in masses of about 1000 or more each about 2 to about 5 centimeters long and about 1 to about 3 centimeters wide, fall through the air in a trajectory that is very effective for decoy use. Such trajectory is steeper at altitudes of 8 kilometers than at sea level, but is suitable at both altitudes as well as at intervening altitudes.

Instead of iron foils other types of pyrophoric or pyrotechnic webs can be used. Nickel foil works about the same way as iron foils but generally shows a somewhat steeper temperature rise and shorter heat-generating dwell along with a higher temperature peak. Woven carbon fiber cloth has a lower density than metal and for use as a missile decoy is preferably about ¼ to about ¾ millimeters thick. Such cloths can be impregnated with pyrophoric powder in sufficient quantity so that when the impregnated cloth is exposed to the air, the pyrophoric powder ignites spontaneously and then ignites the cloth.

Alternatively, the carbon fiber cloth can be ignited with a pyrophoric liquid, an aluminum alkyl for example, by packing a quantity of the cloths inside a discharging shell along with tri-ethyl aluminum.

As shown in the parent applications, the carbon cloth is made easier to ignite as by etching its surface and/or coating the surface with lead or copper acetate deposited from aqueous solution. However, it can be ignited even when not pre-treated.

The carbon cloths can be folded in the manner described above for the metal foil to increase the dwell of their heat output. To retain the folds in the carbon cloth, the cloth can be impregnated with a stiffening resin, like polyethylene terephthalate or polyvinylacetate or polymethylmethacrylate. Alternatively, the carbon fiber can be woven with stiff metal wires or can be woven through a stiff metal screen.

The increased radiation effectiveness described above, is also obtained by adherently coating the radiating surfaces with a layer about 20 to about 500 microns thick of finely divided alumina, silica or zirconia, or mixtures of any two or all three in any proportions. Thus, a 0.4 millimeter-thick web of woven carbon fiber cloth pre-treated with 0.2 molar lead acetate and impregnated with 1% to 10% activated iron powder, is immersed into a 2.5% by weight solution of poly (ethyl acrylate) resin in methylethylketone, then the impregnated cloth is withdrawn from the resin solution, dried for a few seconds and dropped into a container having a quantity of 325-mesh zirconia. The container is shaken in order to get the zirconia particles spread over the cloth, after which the coated cloth is removed and dried. When the dried product is exposed to air, the particles of activated iron ignite and ignite the carbon which then burns and the incandescence thus produced has a high concentration of radiation in the 8-to-14-micron wave length of the spectrum. A somewhat better concentration is obtained when half the zirconia is replaced by alumina.

Silica and/or silicon carbide particles can be used in place of or in mixtures with the zirconia and/or alumina.

The particles can be applied to the carbon cloth web by spraying on it a slurry of the particles in the resin solution. It is preferred that the slurry contain a high concentration of the particles, about 10 to 50 times the weight of the resin.

A preferred technique is to take a flat carbon fiber cloth about 0.5 millimeter thick and pre-dipped as noted above in aqueous lead acetate and then dried, coat one of its faces with a spray of 90 parts by weight of a 1:1 mixture of 325-mesh $ZrO_2$ and $Al_2O_3$ slurried in 100 parts by weight of a 2 weight percent solution of poly (methylmethacrylate) in acetone. The coating is built up to a thickness of about ¼ millimeter, and then permitted to dry. On the opposite face of the cloth there is sprayed on, in an argon atmosphere, about a 70 micron-thick slurry of activated iron powder particles about 10 microns in size, in twice its weight of a 3 weight percent solution of poly (ethyl acrylate) in acetone. This coating can be as much as 300 microns in thickness. For such top coatings the volume of inorganic solids should be at least 80% of the total volume of the dried coating.

The second coating is dried in the argon atmosphere and still in that atmosphere is given a top coating of the $ZrO_2$-$Al_2O_3$-binder slurry, about ¼ the thickness of the original $ZrO_2$-$Al_2O_3$-binder coating, and again the coated cloth is dried in the argon atmosphere. One or more of such coated cloths can be sealed in a plastic bag or decoy shell and will keep until needed for decoy use. At that time, the cloths are exposed to air and will spontaneously ignite. They show a very good thermal radiation in the 8-to-14 micron band. The face carrying the thicker $ZrO_2Al_2O_3$-binder coat shows stronger radiation in that band than the face carrying the thinner such coat.

Even better frequency distribution of the pyrophoric radiation is obtained when the pyrophoric surface coating is borosilicate or borochromate particles in which the boron oxide content is from about 5% to about 80%, preferably at least 25%, and most preferably at least about 50%.

Simple mixtures of $B_2O_3$ and $SiO_2$ tend to be hygroscopic when their $B_2O_3$ content is over about 50%, and should be appropriately handled until they are sintered or fused. A fused mixture of 65% $B_2O_3$ and 35% $SiO_2$ is very effective for radiation adjustment.

Solutions of other tacky resins such as other acrylic resins, polyvinylacetate, polyurethanes, silicones and pressure-sensitive resin formulations can be used in place of the noted poly acrylates. Suspensions of resins in liquids in which they do not dissolve are not particularly effective. However the top coatings can be suspended in an excess of colloidal silica or colloidal alumina dispersions, and applied in this form with or without organic binder.

Where an aluminum alkyl is used for ignition in place of the activated iron, the adhesive resin should not be one in which the alkyl dissolves.

Activated iron or nickel particles, when used, can be applied to the carbon cloth by the techniques described for the zirconia, or the resin-to-activated-powder ratio can be diminished and even reduced to zero. Thus, a resin-free slurry of very finely divided activated powder in water can be sprayed onto one or both faces of the carbon cloth to deposit about 1/50 to about 1/10 gram of the activated powder per square centimeter of cloth surface. After a little drying in argon, there is then sprayed over both faces of the particle-carrying cloth, a slurry of zirconia powder. The binder in the zirconia slurry then holds the activated powder particles in place, and such a coating not over about 100 microns thick does not prevent their pyrophoric reaction when the coated cloth is exposed to air.

The activated iron or nickel particles can alternatively be formed into foils with the help of a binder such as a resin like an acrylate or a polyester. Thus a quantity of pyrophorically activated iron powder in which the particles range in size from about 100 to about 250 microns is stirred into a 10% solution of polyethyl acrylate binder in methyl chloroform, in a proportion of about 4 to 5 parts of the powder to each part by weight of the solid binder. The resulting suspension is stirred and sprayed onto a flat surface of polished aluminum or polyethylene to build up a generally uniform layer about ½ millimeter thick. That layer is then permitted to dry in an argon atmosphere to yield a solid, self-supporting film about 250 microns thick that is readily pulled away from the aluminum or polyethylene surface against which it was cast. That film can then be cut into strips 3 to 10 millimeters wide which when exposed to air generate heat and act as decoys. The strips are also of relatively low density so that after being discharged into the air with or without other decoy strips and chaff, they flutter down.

Thinner strips, such as those that are about 100 microns thick, are somewhat more effective decoys. However the strips can be as thick as ¾ millimeters, and the pyrophoric particles similarly thick.

More effective are strips cut from film that is porous. To prepare such a porous product, the cast suspension has its solvent volatilized away under conditions that cause the solvent to boil. Thus the cast suspension can be inserted into a container which is evacuated to about 1/100 to 3/100 bar to cause bubble formation as the solvent is withdrawn from the layer. Alternatively any of the usual resin-blowing agents used to convert resins to foams can be mixed with the suspensions so that on drying, particularly at elevated temperatures, the suspension layer dries to a porous film.

A more preferred alternative is to roll or press the pyrophoric particles into a film of binder that is soft enough to permit the particles to at least partially penetrate, and adherent enough to hold onto the particles that so penetrate. Low density polyethylene heated to about 50° C. is suitable, as is open-celled or closed-celled microcellular foams of polyethylene or polypropylene or polystyrene or polyvinyl chloride. Such films and foams are available in thicknesses of about ¾ millimeter or less, and can be warmed and/or plasticized to make them softer and more adherent. Temperatures over 50° C. and high pressures are to be avoided inasmuch as they can cause pyrophoric particles to explode even in the absence of oxygen.

A ¾ millimeter thick ribbon of open-celled microcellular polyvinyl chloride foam can thus be coated with a ¾ millimeter high layer of pyrophoric iron particles about 200 to about 800 microns in size, and the unheated coated foam passed in an argon atmosphere through the bight of a pair of steel rollers each five centimeters in diameter spring-urged together by a force of about 10 kilograms. Most of the particles become locked in place in the foam to yield a product having good decoy characteristics. Most of the locked-in particles have at least some of their surfaces exposed so that they pyrophorically react more vigorously than when cast in suspension in a binder solution.

The thermal radiation produced by the foregoing films is of relatively long wave length, and that radiation spectrum can be adjusted for better decoy use by top coating the films with the very finely divided borosilicate and other adjusting materials described hereinabove. These very finely divided particles can be sprinkled onto a sticky film surface, such as that of a heated or incompletely dried film, so that they adhere to the final surface. The thickness of the layer of spectrum adjusting powder should be less than about 10 microns to keep from materially blocking access to the air.

It should be noted that the pyrophoric particles can be prepared by leaching aluminum from iron or nickel aluminides such as the commercially available ground Raney alloys, or by diffusion aluminizing iron or nickel powder, or by sintering such powder with aluminum, as described above.

The pyrophoric metal foils of the present invention can be prepared in large quantities by the use of the open-coil activating technique described in U.S. Pat. No. 4,443,557. A number of individual activating retorts can thus be loaded with an open coil of iron foil, and with the mixture of 20% powdered aluminum and 80% powdered alumina, along with about ½% to about 1% of $AlCl_3$ or $CrCl_3$ activator. The individual retorts so loaded are moved through a furnace as described in connection with FIG. 4 of U.S. Pat. No. 3,903,338, so the contents of each retort reach about 1200° F. for about ½ to about 1 hour. Better results are obtained at lower temperatures and longer times, as for example, 900° F. for 16 hours.

After cooling, the aluminized foil is reacted with aqueous caustic containing dissolved tin as described in the parent applications to leach out some of the aluminum which had diffused into the foil.

Alternatively, the foil can be activated by continuous reeling of a long length through a retort as shown in U.S. Pat. No. 4,435,481. As there described, the activation can be effected on one or both faces of the foil. The mixture of powdered aluminum and powdered alumina should have at least 40% alumina by weight, inasmuch as smaller proportions of alumina will permit some of the powdered aluminum, which melts during the treatment, to wet the foil. This is undesirable inasmuch as it blocks the activated diffusion of the aluminum into the iron. Such activated diffusion brings much more desirable results than diffusion from a melt coating.

For activating a long length of iron or nickel foil, its surface can be aluminized by first depositing powdered aluminum on it as the foil is reeled past a depositing station, and then subjecting the thus coated foil to diffusion conditions to diffuse the aluminum into that surface. The particles of powdered aluminum, less than 250 mesh in size, can be poured onto the surface being coated, or they can be electrophoretically deposited from a suspension in benzene or a 2:1 by weight mixture of isopropanol and nitromethane, or the like. Electrophoretic potentials of about 50 to 200 volts are adequate with suspensions containing about 2 to about 10% aluminum and at temperatures of up to about 80° C. Suspending agents like zein or other proteins, in a concentration of 0.1 to about 0.3 percent by weight can also be included in the suspension.

A little $Al_2O_3$ or other inert powder may be mixed with the aluminum powder to improve the diffusion when the coated foil is subjected to diffusion conditions, particularly at temperatures that cause the aluminum particles to melt. As much as 40% inert material can thus be present, although such material can be completely omitted.

$AlCl_3$ or water-insoluble $CrCl_3$ make very effective activators when diffusion is effected below about 1100° F. At higher temperatures $NH_4Cl$ is preferred. These activators can in powdered form be mixed with the aluminum to the extent of about ½ to about 1% by weight.

Long lengths of activated foil are conveniently cut into the desired pieces or chaff, by doing the cutting while the foil is covered by water or other protective liquid that prevents pyrophoric action. A body of the liquid can first be degased to remove dissolved oxygen, and the leached foil, with or without prior rinsing, introduced along with a rotary chopper, punch, or other cutting tool. The cut pieces or chaff are accumulated in the body of liquid. The cutting tool may have to be operated at a speed substantially less than that used when the tool is not submerged in a liquid.

The rotary chopper cuts transversely across the introduced foil to produce transverse strips having lengths equal to the width of the introduced foil, and having widths that are controlled by the speed with which the foil advances to the chopper and can be as little as one millimeter or as large as about one centimeter. If desired the foil can first be fed through a slitter, also submerged, that cuts longitudinally through the foil to sever it into narrower lengths.

A punch can provide punched-out pieces of almost any shape.

The radar reflectivity associated with pyrophoric foils is also increased by mixing them with standard aluminum radar chaff or foils. Such aluminum foils or chaff only about ½ mil thick or thinner, mixed with two to five times as many pyrophoric one-inch discs of iron foil, make an effective heat and radar decoy when ejected as a mass from an exploding cartridge. The aluminum foil can be thread-like slivers only about 1 millimeter wide or less, to further improve the decoy action. Chaff made by chopping up aluminum-coated plastic or glass fiber, foil or thread is particularly helpful.

Decoy action can also be improved by discharging mixtures of pyrophoric materials in which some of the materials ignite very promptly, and some take a little longer. Thus powdered activated iron or nickel reach radiation temperature in less than a second, whereas foils and binder-containing materials take more than a second. Alternatively the materials can be discharged in successive bursts of smaller quantities to thus prolong the effective radiation.

The following is another example of using the sintering technique to prepare activated products. Thus a mixture of nickel and aluminum powders the particles of which are from about 1 to about 12 microns in size, are in a proportion of 3 atoms aluminum to 1 atom nickel slurried in a 2% solution of polyethylacrylate in methyl chloroform, and the resulting slurry sprayed onto a 50 micron thick steel foil to build up a coating particle thickness of about 25 to about 50 microns on each face. The thus-coated foil is then dried to volatilize off its solvent content, and then embedded in a pack of chromium granules held in a metal retort. A stream of argon is flushed through the retort and then replaced with a stream of hydrogen, while the retort is heated to about 815° C. for about 90 minutes. The retort is then cooled and the coated foils removed. They now show rough sintered-on metal faces which when leached as described above show excellent pyrophoric action.

The nickel and aluminum particles are known to inter-react very aggressively, and the retort heating time can be reduced to as little as 5 minutes or even less. It takes a very few minutes for the powders to reach their inter-reacting temperature of about 300 degrees Centigrade, and once they start to inter-react they generate sufficient heat to take the coatings to above 750° C. to thus complete the sintering to the substrate foil. That substrate can be as thin as 10 microns to further increase the final pyrophoric heat output.

It is not necessary to use a retort. A preheated tube through which argon or hydrogen flows can have passed through it a foil carrying on one face the foregoing coating. In only about one minute the nickel-aluminum reaction takes place to leave a sintered-on product that after leaching shows excellent pyrophoric action.

Steel foil is a very inexpensive substrate, but other metal substrates such as nickel or copper foils can be used.

Iron powder can be substituted for the nickel powder, preferably with the iron-aluminum atom ratio of 1:2, and similar results are obtained. However the reaction between iron powder and aluminum powder is not as aggressive and requires a somewhat higher heat-up temperature.

Cobalt can also be substituted for the nickel, without changing its proportion to aluminum.

The chromium granule bed can be replaced by a bed of powdered alumina, and the hydrogen flush by a helium or argon flush, without significantly altering the results. The retort atmosphere need not contain any diffusion activator to improve the sintering action.

The powder-carrying foil can be heated to reaction temperature without embedding it in a pack. The retorting time for such a treatmen is reduced to less than 15 minutes, inasmuch as there is no pack to heat up.

The foregoing powder-sintering techniques are particularly suited for preparing pyrophoric foil on a continuous basis. Thus a ½, 1 or 2-mil thick substrate foil can be unspooled and passed through gas seals into and out of a heated hydrogen-filled retort in a relatively cool portion of which the inter-reacting powders are poured onto the foil. After the desired dwell in the hot part of the retort the powder-carrying foil is pulled out and then through a leach bath where the leaching is completed in about the same length of time as the sintering so that the sequence can be realistically conducted using a retort path as short as ½ to 1 meter to achieve a high output rate.

Where the final foil is desired to have both surfaces pyrophoric, the sintering step can be repeated with the substrate foil held upside down and a fresh sintering mixture applied to the surface that now faces upwardly.

The proportions of aluminum to nickel or iron can be varied about plus or minus 20% with little loss of effectiveness. Moreover the sintering powder can have its nickel and iron mixed together in any proportion to vary the pyrophoric action. Also the final foil can be made with activated iron on one face and activated nickel on its other face. The activated nickel pyrophorically reacts more sharply but that reaction is completed in substantially less time, so that the dual coatings work a balancing of the reactions on their separate faces.

The foregoing sintering is preferably conducted with reacting particles no larger than about 50 microns. The smaller the particles the more rapid and effective is the sintering, and the use of high heating temperatures such as 1000° C. also helps.

The sintering technique is also suitable for applying protective coatings. Thus, a B-1900 superalloy jet engine blade can have its airfoil portion given a protective nickel aluminide coating by sintering to that portion a mixture of the foregoing finely divided nickel and aluminum powders in 1:1 atomic proportion. In such proportion the powders are even more vigorously interreactive so that heating times can be as indicated above. However for very smooth and adherent protective coatings 20 to 60 microns thick, sintering heat is preferably maintained for at least about 15 to 30 minutes.

Such protective coatings are not significantly attacked by caustic leaches, and they can be modified to increase their protective effects. Thus by also adding chromium powder in an amount about 20% of the total powder, a more protective chromium-containing coating is formed.

The pyrophoric output of activated iron foils or powder is increased when the leaching step is conducted with a little hydrogen peroxide in the leaching liquid. As little as 0.1% $H_2O_2$ by weight of the leachant is enough to show such results, and from about 0.2% to about 0.5% is preferred. Concentrations of 3% or higher tend to darken and diminish the pyrophoric activity.

By way of example, to a 20 weight percent solution of NaOH in water there is added 0.2 weight percent $H_2O_2$, and the resulting mixture at room temperature is used to leach 2 mil thick iron foil that has been aluminized to a depth of ½ mil on both its faces. The leaching generates a very small amount of gas as compared to corresponding leaching without the $H_2O_2$, and is completed in about 30 minutes even if the leach solution warms up to about 50° C. during the leaching.

About the same leach time as in the above illustration is required when the leachant is KOH and starting leach solution is at any temperature from about zero to about 50° C., although leachant that starts at 50° C. can heat up to about 60° C. The foregoing leachings are conducted with about one hundred times as much leach solution as substrate being leached, by weight. Preferred caustic concentrations are from about 8% to about 20% NaOH or KOH in water, by weight.

Instead of pouring $H_2O_2$ into a leach solution, peroxides such as sodium peroxide, potassium peroxide and calcium peroxide can be added to the leach solution to form $H_2O_2$ in situ.

The foil activated in accordance with the foregoing example also shows about 15% more heat output and about 50° F. higher maximum temperature rise than the corresponding foil activated without the help of the $H_2O_2$. Iron powders also show about the same improvements as the foils do.

Leaching of aluminized iron, either foil or powder, is best conducted with some tin or stannite ion dissolved in the leachant, but the concentration of the tin can be reduced to as little as about ½ gram dissolved tin per liter of leachant when the $H_2O_2$ of the present invention is present in the leachant. Preferably the dissolved tin content is as high as 1 gram per liter. Such tin reduction is also noted in the rapid high-temperature leaching of patent Ser. No. 707,656.

Not only is less tin needed in the leachant, but the iron activated with the $H_2O_2$ in the leachant contains less tin than is contained in iron activated pursuant to the prior art. Such tin is introduced as metal into the pores of the activated iron and even in very small amounts helps preserve the activation.

It is noted that the presence of the $H_2O_2$ in the leachant according to the present invention, has an effect opposite to that of the $H_2O_2$ when it is applied to the activated metal after the leaching is completed. Such later application causes the activated metal to lose some or all of its pyrophoricity, and to turn black.

The increase in heat output caused by the presence of the $H_2O_2$ in the leachant, can be heightened by subsequently subjecting the activated metal to the short treatment with dilute acid, with or without the folding, as described above.

Pyrophorically activated nickel, particularly in the form of foil, tends to become passivated in an unpredictable manner. When this happens the material remains activated but will not react with the air unless it is heated to about 50° C. or higher.

It has been discovered that this passivation tendency can be reduced or completely avoided if the leaching step in the activation is conducted at temperatures at least as high as 90° C., and the higher the better. The concentration of caustic in such leaching bath can be as low as 5% by weight, and the time at such elevated temperatures should be at least about 15 minutes. Thus a boiling solution of 10% NaOH in water will leach most activated nickel foils in about 30 minutes to yield a very active product showing no tendency to passivate. Shorter leaching times give a somewhat less active product that still does not passivate unless the leaching time is less than 15 minutes.

Aluminizing can be used to prepare aluminized steel, iron, nickel, stainless steel or other substrates for conversion to Raney-type activated metals, as described in U.S. Pat. No. 4,154,705. Both self-supporting substrates and powdered substrates can be so activated and such activation of powders is described in patent application Ser. No. 507,174. This type of treatment provides the greatest degree of activation for foils or other self-supporting substrates when the aluminizing is effected at the lowest temperatures—below 1000° F.—and at such low temperatures energizers such as inexpensive ammonium halides give undesirable diffusion cases.

According to the present invention, there are provided pyrotechnic compositions which ignite at temperatures above 100° C., e.g., at about 300° C., and have a substantial aluminum content as well as a high thermal output. These compositions are activated aluminides of metals like molybdenum, zirconium and columbium that when not combined with aluminum ignite in air at about 500° C. to 700° C. at atmospheric pressure. These metals are easily combined with aluminum to form alloys or aluminides having two or more atoms of aluminum for each atom of ignitible metal, and when so combined generally have ignition temperatures not much different from that of the pure ignitible metal as noted above. Incorporating about 2% to about 10% boron in such alloy, based on the weight of the ignitible metal, generally lowers the ignition temperature by about 20° C. However, the ignition temperature of the aluminide with or without the boron, is lowered about 100° C. to about 150° C. by activating the aluminide.

The activation of the present invention is the leaching out of some of the aluminum, as with aqueous caustic soda or caustic potash. For this activation, the aluminum alloy preferably has between about 2.5 and 3.5 atoms of aluminum for every atom of alloyed ignitible metal, and the leaching preferably removes all the aluminum in excess of two atoms per atom of ignitible metal. This is illustrated by the following example:

EXAMPLE 7

One kilogram of aluminum covered by a cryolite flux is melted in a stainless steel retort under argon, and there is then stirred into the melt 600 grams of powdered molybdenum. The stirring is continued for about ½ hour while the contents of the retort are maintained at about 1200° C. to about 1400° C. to complete the alloying.

The melt is then permitted to cool and solidify, after which the metal layer is crushed into small pieces and the pieces ground to a maximum particle size of about 0.3 millimeter. The ground product is now poured into an excess of 25% NaOH solution in water. Bubbles are immediately evolved as the caustic attacks the alloy particles, and the evolution begins to noticeably slow down after several hours, reaching a very low level after about six hours. The caustic is then poured off, and the residual particles washed with water and dried.

Thus activated, the particles have a porous surface and are stable in air at temperatures as high as 300° C. However, when a mass of the particles is heated in air to above that temperature, the particles ignite and vigorously react with the air. The reaction is an oxidation and is completed on the smaller particles before it is completed on the larger particles of the ground mass, so that the pyrotechnic effect is more intense for about the first minute, and drops off somewhat for about another minute. On an asbestos pad the oxidizing particles become red hot and gradually crumble to a powder. Such pyrotechnics generate temperatures well over 1000° C., and can accordingly be used to supply heat for the bright annealing or other purposes.

Zirconium and columbium behave very similarly when treated as in the foregoing Example. After activation they ignite at about 350° C. in air at atmospheric pressure, and the ignition point of their aluminum alloy before activation is about 500° C., being not much different from the ignition point of the pure metals.

The activities of the activated alloys are lower when the leaching is terminated earlier, and are also lower when the alloys subjected to the activation have a less than 3:1 proportion of aluminum atoms to ignitible metal atoms. There are also some reactivity increases when the leaching is made more intense, as by starting with a hot or boiling caustic solution, and by increasing the caustic concentration to saturation. However, very good reactivity is obtained when the leaching is effected at 20° C., although the leaching is slower at that temperature. At boiling temperatures with saturated caustic, the leaching can be completed in less than two minutes.

It is not essential for the aluminides of the present invention to be prepared by melting. Thus, iron, zirconium, titanium, molybdenum and columbium can be effectively alloyed with aluminum by a thermal diffusion. Fine powders of the separate alloy ingredients can be uniformly mixed in a diffusion coating retort and heated to about 600° C. in an $AlCl_3$ atmosphere for only about six hours to produce usable alloy when the ignitible metal powder particles are no larger than about 10 microns. Larger particles take a little longer. Other halide atmospheres, such as of anhydrous $CrCl_3$, either in its water-soluble or water-insoluble form, or elemental chlorine, bromine or iodine, can be used in place of the $AlCl_3$ as the diffusion-energizing atmosphere. Only about ½% to about 1% of such energizer is mixed with the powders to be alloyed.

Tri-aluminides of some of the noted metals are also available as articles of commerce.

The leaching of the present invention can also be effected with inhibited hydrochloric acid, but the resulting activation is not as great as produced by caustic leaches, and is sometimes absent.

There can also be included in the foregoing alloys ingredients that improve the pyrotechnic behavior. Thus, about 2% to 20% of boron or magnesium or iron or mixtures of these, are helpful in this respect, and can be added to a melt or to a diffusion-alloying mixture. Also, these metals can be introduced by diffusion into a pre-formed aluminide or by diffusion with the aluminum. For example, 250 grams of powdered $ZrAl_4$ can be mixed with 10 grams of powdered boron and 5 grams of sodium fluoborate, and subjected to a diffusion heat as described in U.S. Pat. No. 3,801,357, but without using inert solid diluent, for three hours at 1800° F. in an argon-bathed atmosphere.

About 1% to about 10% of iron can be similarly introduced into the aluminide with or without the boron, to provide activatable alloys that after activation ignite at temperatures of about 300° C. or a little lower. Magnesium-aluminum alloys can also be activated by the foregoing techniques to provide activated material having ignition temperatures below 300° C. The magnesium-aluminum alloys preferably have, before activation, at least two atoms of aluminum for every atom of magnesium, but can be activated even when the aluminum-magnesium atom proportion is as low as 1½:1. The aluminum-to-zirconium atom ratio is preferably at least 4:1 but can be as low as 2:1.

Including 2% to 20% boron in the magnesium-aluminum or zirconium-aluminum alloys, based on the weight of the magnesium or zirconium, also increases their pyrotechnic output.

The foregoing pyrotechnic improvements are also obtained with alloys in the form of foils and sheets, as well as powders.

The boron additions of the present invention can also be effected by the procedures described in U.S. Pat. No. 4,536,215.

The foregoing low-ignition-point activated alloys are readily ignited with an ordinary household match.

Metals can be boronized instead of metallized, to increase their surface hardness as described for example in U.S. Pat. Nos. 3,673,005 and 3,935,034. No leaching is needed, and indeed the addition of activators is not necessary but is sometimes helpful. Boronizing of low carbon or medium carbon steels is particularly desirable because these steels are very inexpensive. Thus, the process of Example 5 in the '034 patent gives very good results when conducted in a hydrogen atmosphere on 1010 steel. Similarly low-chromium steel is given a particularly hard surface when packed with amorphous boron only and heated to 1700° F. for one hour under hydrogen.

Improved results are obtained when boronizing ferrous metals, by arranging for the boronized coating to have little of no FeB. An $Fe_2B$ coating appears to provide a very hard product that does not delaminate or crack.

To achieve the foregoing low-boron coatings, diffusion boronizing is carried out in a pack having powdered iron boride in a proportion that deposits little or no FeB. Thus a plain carbon steel workpiece can be packed in an iron boride having a 1:1 atomic mixture of iron and boron, and fired at 1600° F. for 3 hours under argon. A little fluoride activator like ½% NH₄F helps provide a more uniformly coated product. Such an activator can be added as a bottom layer in the diffusion coating retort, and does not have to be uniformly mixed into the pack.

Iron-boron packs in which the iron content is at least about 20 atom percent and as high as about 65% are thus desirable, and firings can be at temperatures from about 1350° to about 2000° F. for 1 to 6 hours. Activators other than NH₄F can be used.

Similar improvements are obtained with nickel, chromium, titanium, manganese, tantalum, molybdenum, vanadium, zirconium, hafnium and cobalt workpieces, by using corresponding metal borides in the diffusion coating packs.

Obviously many modifications and variations of the present invention are possible in light of the above teachings. It is, therefore, to be understood that within the scope of the appended claims the invention may be practiced otherwise than as specified.

I claim:

1. In the coating of a metal substrate with finely divided aluminide-forming metal powder mixture from a suspension of the powder, the improvement comprising suspending the powder in a water solution of an inorganic binder.

2. The method of claim 1 in which the binder is an alkali metal silicate.

3. The method of claim 1 wherein the metal powder consists essentially of a mixture of aluminum and at least one metal selected from the group consisting of iron, nickel and cobalt.

4. The method of claim 16 in which the binder is an alkali metal silicate having an $SiO_2$ to $M_2O$ mol ratio higher than 2.8.

5. The method of claim 3 in which the water solution contains an inhibitor that keeps the aluminum from reacting with the water.

6. The method of claim 1 wherein the solution has dispersed therein not more than 3% by weight of an organic binder which is substantially completely driven off by heating the coated substrate to 600° C.

7. The method of claim 6 in which the organic binder is polyvinylalcohol.

8. The method of claim 7 in which a defoamer is also present in the solution.

9. The method of claim 1 in which the metal substrate is a stratum not over about 2 mils in thickness.

10. The method of claim 9 in which the metal substrate is a steel foil obtained by treating a thicker foil with aqueous nitric acid to reduce its thickness.

* * * * *

UNITED STATES PATENT AND TRADEMARK OFFICE
CERTIFICATE OF CORRECTION

PATENT NO. : 5,102,700
DATED : April 7, 1992
INVENTOR(S) : Alfonso L. Baldi

It is certified that error appears in the above-indentified patent and that said Letters Patent is hereby corrected as shown below:

Column 3, line 48 should read as follows:
  --An alternative substrate is a tow of a single thickness--.

Column 30, line 7 should read as follows:
  --The method of claim 3 in which the binder is an--.

Signed and Sealed this

Twentieth Day of July, 1993

Attest:

MICHAEL K. KIRK

*Attesting Officer*    Acting Commissioner of Patents and Trademarks